United States Patent
Huang

(10) Patent No.: US 7,733,139 B2
(45) Date of Patent: Jun. 8, 2010

(54) DELAY LOCKED LOOP CIRCUIT AND METHOD FOR ELIMINATING JITTER AND OFFSET THEREIN

(75) Inventor: Chih-Haur Huang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 9 days.

(21) Appl. No.: 12/010,554

(22) Filed: Jan. 25, 2008

(65) Prior Publication Data

US 2009/0189657 A1    Jul. 30, 2009

(51) Int. Cl.
*H03L 7/06* (2006.01)
(52) U.S. Cl. ..................................... 327/158
(58) Field of Classification Search ................. 327/158
See application file for complete search history.

(56) References Cited

U.S. PATENT DOCUMENTS

| | | | | |
|---|---|---|---|---|
| 6,307,906 B1* | 10/2001 | Tanji et al. | ............ | 375/376 |
| 6,927,611 B2* | 8/2005 | Rhee et al. | ............ | 327/149 |
| 7,019,572 B2* | 3/2006 | Miki et al. | ............ | 327/157 |
| 7,042,252 B2* | 5/2006 | Galloway et al. | ............ | 327/16 |
| 7,078,977 B2* | 7/2006 | Maneatis | ............ | 331/16 |
| 7,135,934 B2* | 11/2006 | Sanchez et al. | ............ | 331/18 |
| 7,251,573 B2* | 7/2007 | Sanduleanu et al. | ............ | 702/79 |
| 7,310,021 B2* | 12/2007 | Familia | ............ | 331/17 |
| 7,420,428 B2* | 9/2008 | Pera et al. | ............ | 331/17 |
| 7,551,909 B1* | 6/2009 | Moon et al. | ............ | 455/260 |
| 2005/0024155 A1* | 2/2005 | Huang | ............ | 331/25 |
| 2007/0162806 A1* | 7/2007 | Matsumoto et al. | ............ | 714/728 |
| 2008/0024160 A1* | 1/2008 | Ou-yang et al. | ............ | 326/30 |
| 2009/0074125 A1* | 3/2009 | Lin | ............ | 375/375 |
| 2009/0146704 A1* | 6/2009 | Huang | ............ | 327/158 |
| 2009/0146705 A1* | 6/2009 | Huang | ............ | 327/158 |
| 2009/0147903 A1* | 6/2009 | Kikuchi et al. | ............ | 375/376 |

\* cited by examiner

*Primary Examiner*—Lincoln Donovan
*Assistant Examiner*—Adam D Houston
(74) *Attorney, Agent, or Firm*—Rabin & Berdo, P.C.

(57) ABSTRACT

A delay locked loop circuit includes a phase-frequency detector, a sampler, a charge pump, a bias generator and a voltage-controlled element. The phase-frequency detector outputs at least one difference signal by detecting a phase difference between an input clock signal and a feedback clock signal. The sampler outputs at least one sampled signal by delaying the difference signal in accordance with the input clock signal. The charge pump generates a control voltage in accordance with the sampled signal. The bias generator generates at least one bias voltage in accordance with the control voltage. The voltage-controlled element is controlled with the bias voltage to output the feedback clock signal to the phase-frequency detector in accordance with the input clock signal. A method for eliminating jitter and offset between an input clock signal and an output clock signal in a delay locked loop circuit is also disclosed.

7 Claims, 4 Drawing Sheets

DELAY LOCKED LOOP CIRCUIT AND METHOD FOR ELIMINATING JITTER AND OFFSET THEREIN

BACKGROUND

1. Field of Invention

The present invention relates to a clock synchronization circuit. More particularly, the present invention relates to a delay locked loop (DLL) circuit and a method for eliminating jitter and offset therein.

2. Description of Related Art

Clock synchronization circuits are commonly used in electronic systems to provide good clock distribution, which is very important to overall performance of a product. Examples of such clock synchronization circuits include a phase locked loop (PLL) circuit and a delay locked loop (DLL) circuit. Conceptually, PLL and DLL circuits operate similarly. For DLL circuits, they include analog DLL circuits and digital DLL circuits, in which the analog DLL circuits have different performances from the digital DLL circuits.

FIG. 1 illustrates a typical analog DLL circuit. The analog DLL circuit 100 includes a phase-frequency detector (PFD) 102, a charge pump (CP) 104, a low pass filter (LPF) 106, a bias generator 108 and a voltage controlled delay line (VCDL) 110. The PFD 102 compares the phase difference between an input clock signal CKIN and a feedback clock signal CKON, and has two outputs UP and DN. The output of the PFD 102 is a pulse with a width equal to the amount by which CKIN leads or lags CKON. If CKIN leads CKON, the pulse appears on the UP output of the PFD 102. If CKIN lags CKON, the pulse appears on the DN output of the PFD 102.

The UP and DN outputs are input to the charge pump 104, and the charge pump 104 converts the input, either UP or DN, into an analog current for subsequent processing. The output current of the charge pump 104 is input to the LPF 106, and the LPF 106 functions to integrate the current output from the charge pump 104 to generate a control voltage VCTL. After that, the control voltage VCTL is input to the bias generator 108, and the bias generator 108 generates two outputs VBP and VBN according to the control voltage VCTL. Then, the VCDL 110 controls the frequency of the input clock signal CKIN based on the outputs VBP and VBN generated by the bias generator 108, so as to output N clock signals, i.e. CKO [1:N], that have different phases from each other, in which the output clock signal CKON is fed back to the PFD 102 to be compared.

However, the operation frequency of the analog DLL circuit 100 described above is still too high, such that the control voltage VCTL changes too fast and the analog DLL circuit 100 cannot work stably. Besides, the LPF 106 in the analog DLL circuit 100 is usually designed on a large area to suppress high frequency noise, thereby providing stability to the operation of the analog DLL circuit 100. Thus, the production cost and size of the analog DLL circuit 100 including the LPF 106 cannot be reduced.

SUMMARY

In accordance with one embodiment of the present invention, a delay locked loop circuit is provided. The delay locked loop circuit includes a phase-frequency detector, a sampler, a charge pump, a bias generator and a voltage-controlled element. The phase-frequency detector outputs at least one difference signal by detecting a phase difference between an input clock signal and a feedback clock signal. The sampler outputs at least one sampled signal by delaying the difference signal output from the phase-frequency detector in accordance with the input clock signal. The charge pump generates a control voltage in accordance with the sampled signal output from the sampler. The bias generator generates at least one bias voltage in accordance with the control voltage generated by the charge pump. The voltage-controlled element is controlled with the bias voltage generated by the bias generator to generate an output clock signal and to output the feedback clock signal to the phase-frequency detector in accordance with the input clock signal.

In accordance with another embodiment of the present invention, a delay locked loop circuit is provided. The delay locked loop circuit includes a phase-frequency detector, a flip-flop, an XNOR gate, a charge pump, a bias generator and a voltage-controlled element. The phase-frequency detector outputs at least one difference signal by detecting a phase difference between an input clock signal and a feedback clock signal. The flip-flop delays the difference signal output from the phase-frequency detector in accordance with the input clock signal to output a delay signal. The XNOR gate receives the difference signal and the delay signal to output a logic signal. The charge pump generates a control voltage in accordance with the logic signal output from the XNOR gate. The bias generator generates at least one bias voltage in accordance with the control voltage generated by the charge pump. The voltage-controlled element is controlled with the bias voltage generated by the bias generator to generate an output clock signal and to output the feedback clock signal to the phase-frequency detector in accordance with the input clock signal.

In accordance with yet another embodiment of the present invention, a delay locked loop circuit is provided. The delay locked loop circuit includes a phase-frequency detector, a first flip-flop, a second flip-flop, an XNOR gate, a charge pump, a bias generator and a voltage-controlled element. The phase-frequency detector outputs at least one difference signal by detecting a phase difference between an input clock signal and a feedback clock signal. The first flip-flop delays the difference signal output from the phase-frequency detector to output a first delay signal. The second flip-flop delays the first delay signal output from the first flip-flop to output a second delay signal. The XNOR gate receives the difference signal, the first delay signal and the second delay signal to output a logic signal. The charge pump generates a control voltage in accordance with the logic signal output from the XNOR gate. The bias generator generates at least one bias voltage in accordance with the control voltage generated by the charge pump. The voltage-controlled element is controlled with the bias voltage generated by the bias generator to generate an output clock signal and to output the feedback clock signal to the phase-frequency detector in accordance with the input clock signal.

In accordance with yet another embodiment of the present invention, a method for eliminating jitter and offset between an input clock signal and an output clock signal in a delay locked loop circuit is provided. The method includes the steps of: determining a phase difference between the input clock signal and a feedback clock signal; generating a difference signal corresponding to the phase difference; sampling the difference signal to output a sampled signal in accordance with the input clock signal; generating a control voltage in accordance with the delay signal; generating a bias voltage corresponding to the control voltage; and delaying the input clock signal in accordance with the bias voltage to generate the output clock signal and the feedback clock signal, wherein the output clock signal has a phase substantially equal to the input clock signal.

For the foregoing embodiments of the present invention, the delay locked loop (DLL) circuit and the method for eliminating jitter and offset can be applied such that the DLL circuit can operate stably without low pass filter (LPF) and the production cost and size of the DLL circuit can be reduced as well.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DESCRIPTION OF THE PREFERRED EMBODIMENTS

In the following detailed description, the embodiments of the present invention have been shown and described. As will be realized, the invention is capable of modification in various obvious respects, all without departing from the invention. Accordingly, the drawings and description are to be regarded as illustrative in nature, and not restrictive.

Figure 1:
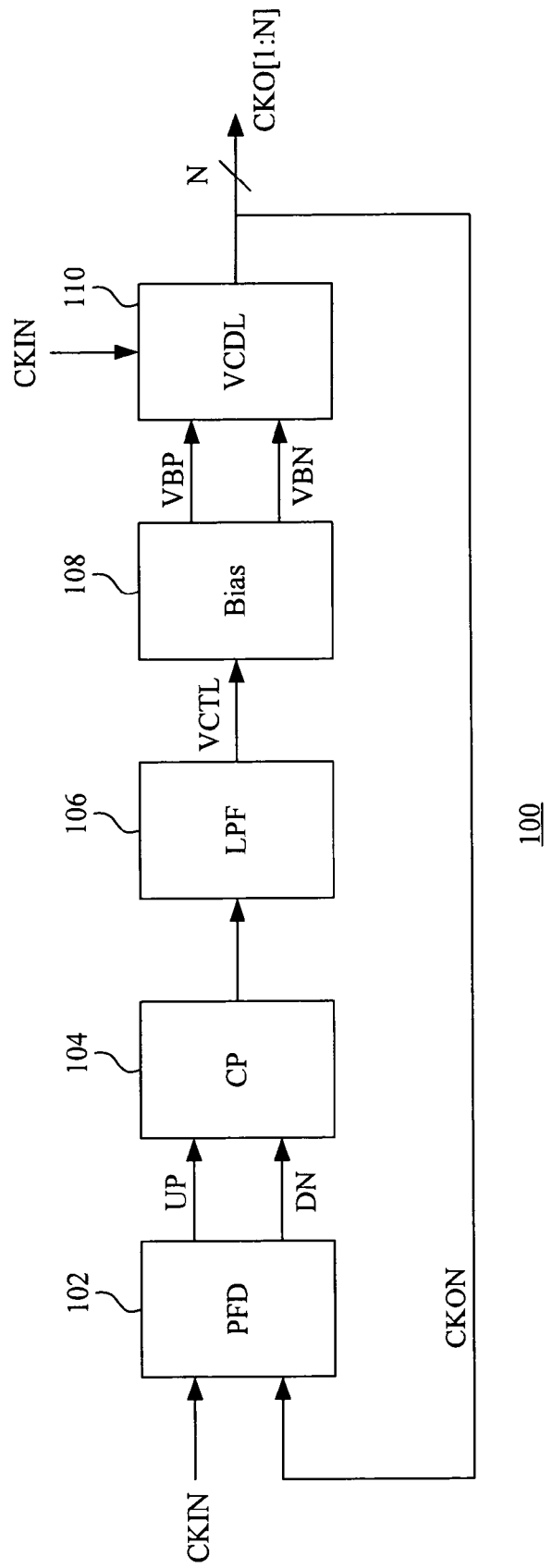
FIG. 1 illustrates a typical analog DLL circuit.
Figure 2:
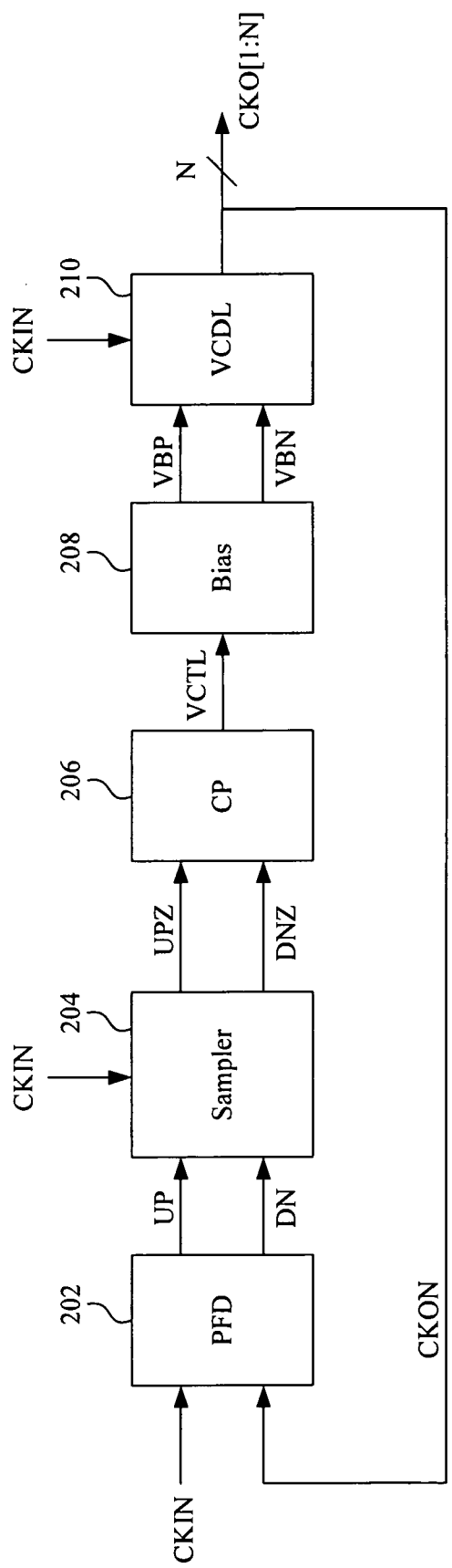
FIG. 2 illustrates a delay locked loop circuit according to one embodiment of the present invention.

FIG. 2 illustrates a delay locked loop circuit according to one embodiment of the present invention. The delay locked loop (DLL) circuit 200 includes a phase-frequency detector (PFD) 202, a sampler 204, a charge pump (CP) 206, a bias generator 208 and a voltage-controlled element, e.g. a voltage controlled delay line (VCDL) 210. The phase-frequency detector 202 detects a phase difference between an input clock signal CKIN and a feedback clock signal CKON. The phase-frequency detector 202 has two outputs UP and DN, and outputs at least one difference signal on the UP or DN output after detecting the phase difference between the input clock signal CKIN and the feedback clock signal CKON. The difference signal output from the phase-frequency detector 202 is a pulse having a width equal to the amount by which CKIN leads or lags CKON. If CKIN leads CKON, the pulse appears on the UP output of the phase-frequency detector 202. If CKIN lags CKON, the pulse appears on the DN output of the phase-frequency detector 202.

The sampler 204 has two outputs UPZ and DNZ, and delays the difference signal output from the phase-frequency detector 202, thereby outputting at least one sampled signal, which has lower frequency than that of the difference signal, on the UPZ or DNZ output in accordance with the input clock signal CKIN after delaying the difference signal. Accordingly, the operation frequency of the DLL circuit 200 can be reduced.

Figure 3:
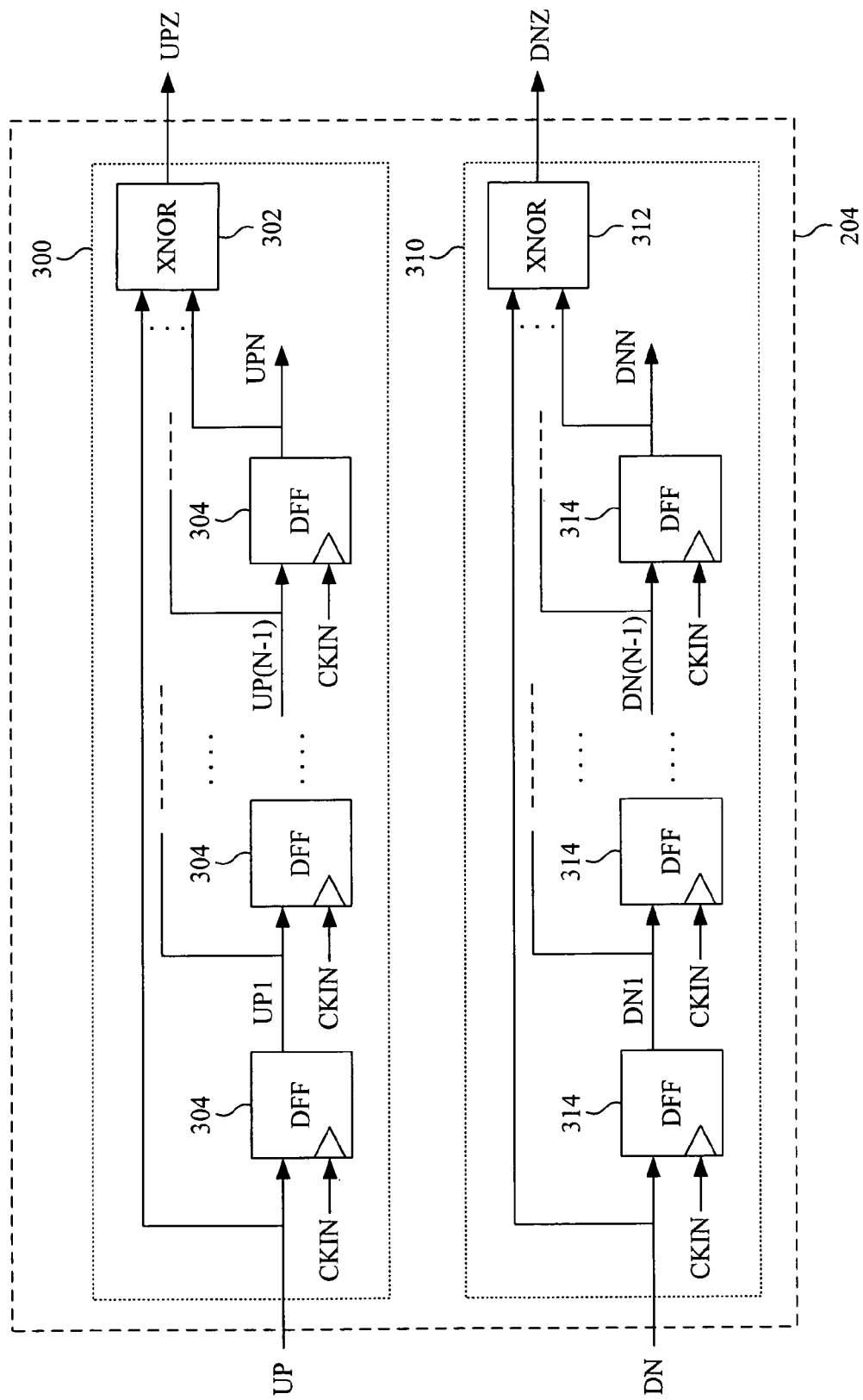
FIG. 3 illustrates the sampler shown in FIG. 2 according to one embodiment of the present invention.

FIG. 3 illustrates the sampler shown in FIG. 2 according to one embodiment of the present invention. In the present embodiment, the sampler 204 includes a UP part 300 and a DN part 310 for processing the UP output and the DN output, respectively, of the phase-frequency detector 202. The UP part 300 includes an XNOR gate 302 and N flip-flops, in which each of the flip-flops is a D flip-flop 304 in the present embodiment. The D flip-flops 304 are cascade-connected. When the difference signal on the UP output of the phase-frequency detector 202 is input into the $1^{st}$ D flip-flop 304, the $1^{st}$ D flip-flop 304 delays the difference signal in accordance with the input clock signal CKIN to output a $1^{st}$ delay signal UP1 to the $2^{nd}$ D flip-flop 304. Then, when the $1^{st}$ delay signal UP1 is input into the $2^{nd}$ D flip-flop 304, the $2^{nd}$ D flip-flop 304 delays the $1^{st}$ delay signal UP1 in accordance with the input clock signal CKIN to output a $2^{nd}$ delay signal UP2 to the $3^{rd}$ D flip-flop 304. That is, when the $(N-1)^{th}$ delay signal UP(N-1) is input into the $N^{th}$ D flip-flop 304, the $N^{th}$ D flip-flop 304 delays the $(N-1)^{th}$ delay signal UP(N-1) in accordance with the input clock signal CKIN to output an $N^{th}$ delay signal UPN.

After that, the difference signal on the UP input of the sampler 204, the $1^{st}$ delay signal UP1, the $2^{nd}$ delay signal UP2, . . . and the $N^{th}$ delay signal UPN are sequentially input into the XNOR gate 302. After the operation, the XNOR gate 302 outputs a logic signal as the sampled signal on the UPZ output, and the difference signal on the UP input of the sampler 204 is accordingly N times the frequency of the sampled signal on the UPZ output of the sampler 204. Therefore, for the overall performance, the operation frequency of the DLL circuit 200 is reduced.

Similarly, the DN part 310 also includes an XNOR gate 312 and N flip-flops, in which each of the flip-flops is a D flip-flop 314 in the present embodiment. The D flip-flops 314 are cascade-connected. When the difference signal on the DN output of the phase-frequency detector 202 is input into the $1^{st}$ D flip-flop 314, the $1^{st}$ D flip-flop 314 delays the difference signal in accordance with the input clock signal CKIN to output a $1^{st}$ delay signal DN1 to the $2^{nd}$ D flip-flop 314. Then, when the $1^{st}$ delay signal DN1 is input into the $2^{nd}$ D flip-flop 314, the $2^{nd}$ D flip-flop 314 delays the $1^{st}$ delay signal DN1 in accordance with the input clock signal CKIN to output a $2^{nd}$ delay signal DN2 to the $3^{rd}$ D flip-flop 314. That is, when the $(N-1)^{th}$ delay signal DN(N-1) is input into the $N^{th}$ D flip-flop 314, the $N^{th}$ D flip-flop 314 delays the $(N-1)^{th}$ delay signal DN(N-1) in accordance with the input clock signal CKIN to output an $N^{th}$ delay signal DNN.

After that, the difference signal on the DN input of the sampler 204, the $1^{st}$ delay signal DN1, the $2^{nd}$ delay signal DN2, . . . and the $N^{th}$ delay signal DNN are sequentially input into the XNOR gate 312. After the operation, the XNOR gate 312 outputs a logic signal as the sampled signal on the DNZ output, and the difference signal on the DN input of the sampler 204 is accordingly N times the frequency of the sampled signal on the DNZ output of the sampler 204. Therefore, for the overall performance, the operation frequency of the DLL circuit 200 is reduced.

As a result, the operation frequency of the DLL circuit 200 can be changed based on the number of the flip-flops used in the sampler 204. In one embodiment, the sampler 204 includes only one flip-flop for processing the difference signal on the input, either UP or DN.

Furthermore, the XNOR gate and the flip-flops (in UP part 300 or DN part 310) are not necessarily included in the sampler 204; that is, the XNOR gate and the flip-flops can be directly operated together with the phase-frequency detector 202 and the charge pump 206, so as to lower the operation frequency of the DLL circuit 200.

Refer back to FIG. 2. The charge pump 206 is coupled to the sampler 204, such that the UPZ and DNZ outputs of the sampler 204 are input to the charge pump 206. Then, the charge pump 206 generates a control voltage VCTL in accordance with the UPZ and DNZ outputs of the sampler 204. The bias generator 208 is coupled to the charge pump 206, such that the control voltage VCTL is input to the bias generator 208. After that, the bias generator 208 generates two outputs VBP and VBN according to the control voltage VCTL.

The voltage controlled delay line 210 is controlled with the bias voltages VBP and VBN and configured for delaying the input clock signal CKIN to output N clock signals, i.e. CKO[1:N], in which the last output clock signal CKON is fed back to the phase-frequency detector 202 to be compared. More particularly, the voltage controlled delay line 210 is configured to add a variable amount of delay to the input clock signal CKIN according to the bias voltages VBP and VBN. That is, the voltage controlled delay line 210 adds or subtracts sufficient delay in accordance with the bias voltages VBP and VBN to output the clock signals CKO[1:N] with different phases and to make the phase of the output clock signal CKON match the phase of the input clock signal CKIN.

Figure 4:
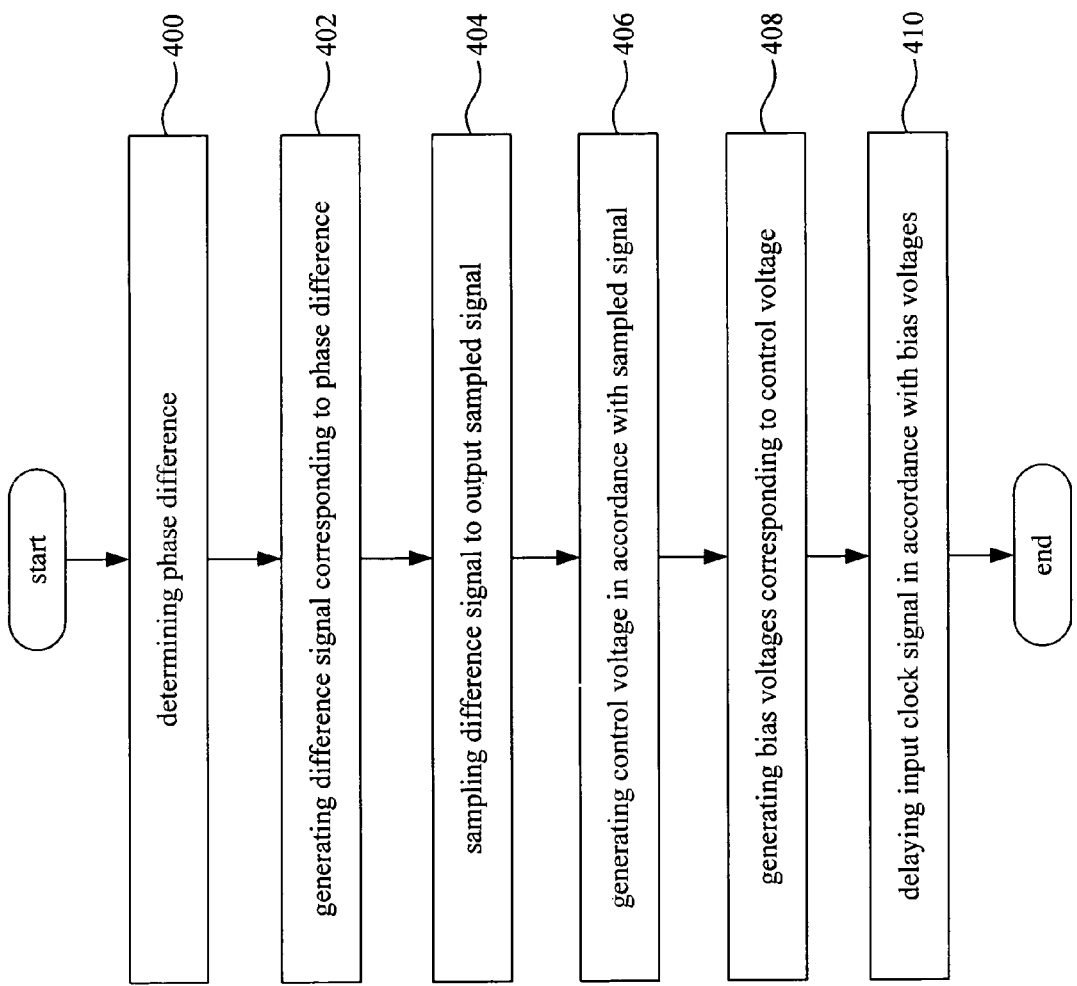
FIG. 4 illustrates a flow chart of the method for eliminating jitter and offset between an input clock signal and an output clock signal in a delay locked loop circuit according to one embodiment of the present invention.

FIG. 4 illustrates a flow chart of the method for eliminating jitter and offset between an input clock signal and an output clock signal in a delay locked loop circuit according to one embodiment of the present invention. Refer to FIGS. 2 and 4. First, a phase difference between the input clock signal CKIN and the feedback clock signal CKON is determined (Step 400). Then, a difference signal corresponding to the phase difference is generated (Step 402), in which Step 400 and Step 402 can be performed by the phase-frequency detector 202. After that, the difference signal is sampled to output a sampled signal, which has lower frequency than that of the difference signal, in accordance with the input clock signal CKIN (Step 404), in which Step 404 can be carried out by the sampler 204. Accordingly, the operation frequency of the DLL circuit 200 can be reduced.

In one embodiment, the step of sampling the difference signal to output the sampled signal in accordance with the input clock signal CKIN (Step 404) can further include the steps of: delaying the difference signal in accordance with the input clock signal CKIN to output a delay signal; and performing XNOR operation of the difference signal and the delay signal to output a logic signal as the sampled signal.

In another embodiment, the step of sampling the difference signal to output the sampled signal in accordance with the input clock signal CKIN (Step 404) can further include the steps of: delaying the difference signal in accordance with the input clock signal CKIN to output a $1^{st}$ delay signal; delaying the $1^{st}$ delay signal in accordance with the input clock signal CKIN to output a $2^{nd}$ delay signal; that is, delaying the $(N-1)^{th}$ delay signal in accordance with the input clock signal CKIN to output an $N^{th}$ delay signal; and then performing XNOR operation of the difference signal, the $1^{st}$ delay signal, the $2^{nd}$ delay signal, ... and the $N^{th}$ delay signal to output a logic signal as the sampled signal. The difference signal is accordingly N times the frequency of the sampled signal. Therefore, for the overall performance, the operation frequency of the DLL circuit 200 is reduced.

After the sampled signal is output, a control voltage VCTL is generated in accordance with the sampled signal (Step 406), and the control voltage VCTL can be generated by the charge pump 206. Then, two bias voltages VBP and VBN corresponding to the control voltage VCTL are generated (Step 408), in which Step 408 can be performed by the bias generator 208. After that, the input clock signal CKIN is delayed in accordance with the bias voltages VBP and VBN to generate the output clock signals (Step 410), i.e. CKO[1:N], in which the output clock signal CKON is fed back to be compared with the input clock signal CKIN, and also has a phase substantially equal to the input clock signal CKIN when the DLL circuit 400 in the locked condition. Besides, Step 410 can be carried out by the voltage controlled delay line (VCDL) 210.

As a result, the operation frequency of the DLL circuit 200 can be changed based on the step of sampling the difference signal in accordance with the input clock signal CKIN (Step 404). In other words, delaying the difference signal lowers the operation frequency of the DLL circuit 200.

For the foregoing embodiments of the present invention, the delay locked loop (DLL) circuit and the method for eliminating jitter and offset can be applied such that the frequency of the DLL circuit can be lowered and the DLL circuit can thus operate stably without low pass filter (LPF). Moreover, the production cost and size of the DLL circuit can be reduced as well.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A delay locked loop circuit, comprising:
    a phase-frequency detector outputting a difference signal by detecting a phase difference between an input clock signal and a feedback clock signal;
    a sampler outputting a sampled signal having a lower frequency than a frequency of the difference signal by delaying the difference signal output from the phase-frequency detector in accordance with the input clock signal, wherein the sampler comprises:
        a first flip-flop delaying the difference signal output from the phase-frequency detector in accordance with the input clock signal to output a first delay signal,
        a second flip-flop delaying the first delay signal output from the first flip-flop in accordance with the input clock signal to output a second delay signal, and
        an XNOR gate receiving the difference signal, the first delay signal and the second delay signal to output a logic signal as the sampled signal;
    a charge pump for generating a control voltage in accordance with the sampled signal output from the sampler;
    a bias generator for generating a bias voltage in accordance with the control voltage generated by the charge pump; and
    a voltage-controlled element controlled with the bias voltage generated by the bias generator to generate an output clock signal and to output the feedback clock signal to the phase-frequency detector in accordance with the input clock signal.

2. The delay locked loop circuit as claimed in claim 1, wherein both the first flip-flop and the second flip-flop are D flip-flops.

3. The delay locked loop circuit as claimed in claim 1, wherein the voltage-controlled element comprises a voltage-controlled delay line.

4. A delay locked loop circuit, comprising:
    a phase-frequency detector outputting a difference signal by detecting a phase difference between an input clock signal and a feedback clock signal;
    a first flip-flop for delaying the difference signal output from the phase-frequency detector to output a first delay signal;
    a second flip-flop for delaying the first delay signal output from the first flip-flop to output a second delay signal;

an XNOR gate receiving the difference signal, the first delay signal and the second delay signal to output a logic signal;

a charge pump for generating a control voltage in accordance with the logic signal output from the XNOR gate;

a bias generator for generating a bias voltage in accordance with the control voltage generated by the charge pump; and a voltage-controlled element controlled with the bias voltage generated by the bias generator to generate an output clock signal and to output the feedback clock signal to the phase-frequency detector in accordance with the input clock signal.

5. The delay locked loop circuit as claimed in claim 4, wherein both the first flip-flop and the second flip-flop are D flip-flops.

6. The delay locked loop circuit as claimed in claim 4, wherein the voltage-controlled element comprises a voltage-controlled delay line.

7. A method for eliminating jitter and offset between an input clock signal and an output clock signal in a delay locked loop circuit, comprising the steps of:

determining a phase difference between the input clock signal and a feedback clock signal;

generating a difference signal corresponding to the phase difference;

sampling the difference signal to output a sampled signal having a lower frequency than a frequency of the difference signal in accordance with the input clock signal, wherein the step of sampling the difference signal comprises the steps of:

delaying the difference signal in accordance with the input clock signal to output a first delay signal, delaying the first delay signal in accordance with the input clock signal to output a second delay signal, and performing XNOR operation of the difference signal, the first delay signal and the second delay signal to output a logic signal as the sampled signal;

generating a control voltage in accordance with the sampled signal;

generating a bias voltage corresponding to the control voltage; and delaying the input clock signal in accordance with the bias voltage to generate the output clock signal and the feedback clock signal, wherein the output clock signal has a phase substantially equal to the input clock signal.

* * * * *